(12) United States Patent
Wakimoto

(10) Patent No.: US 8,390,491 B2
(45) Date of Patent: Mar. 5, 2013

(54) BUFFER TO DRIVE REFERENCE VOLTAGE

(75) Inventor: Tsutomu Wakimoto, Tokyo (JP)

(73) Assignee: Analog Devices, Inc., Norwood, MA (US)

( * ) Notice: Subject to any disclaimer, the term of this patent is extended or adjusted under 35 U.S.C. 154(b) by 153 days.

(21) Appl. No.: 13/007,409

(22) Filed: Jan. 14, 2011

(65) Prior Publication Data

US 2012/0182167 A1   Jul. 19, 2012

(51) Int. Cl.
*H03M 1/00*  (2006.01)

(52) U.S. Cl. ........ 341/135; 341/136; 341/144; 341/155; 327/539; 327/540; 327/541; 327/542; 327/543; 323/312; 323/313; 323/314; 323/315; 323/316; 330/288; 330/290; 330/296

(58) Field of Classification Search .......... 341/118, 341/120, 135, 136, 144, 155; 323/312–316; 327/539–543; 330/288, 290, 296
See application file for complete search history.

(56) References Cited

U.S. PATENT DOCUMENTS

| | | | |
|---|---|---|---|
| 4,287,439 A | 9/1981 | Leuschner | |
| 5,854,574 A | 12/1998 | Singer et al. | |
| 6,184,744 B1 * | 2/2001 | Morishita | 327/541 |
| 6,414,552 B1 | 7/2002 | Kronmueller et al. | |
| 6,480,069 B2 * | 11/2002 | Yasukouchi | 330/288 |
| 6,642,792 B2 * | 11/2003 | Takeuchi et al. | 330/257 |
| 6,653,961 B1 * | 11/2003 | Gosser et al. | 341/144 |
| 6,714,081 B1 * | 3/2004 | Xu | 330/296 |
| 6,720,755 B1 | 4/2004 | Sharpe-Geisler | |
| 6,741,195 B1 * | 5/2004 | Cho | 341/136 |
| 6,753,721 B2 * | 6/2004 | Otsuka et al. | 327/540 |
| 7,176,760 B2 | 2/2007 | Jones | |
| 7,208,998 B2 * | 4/2007 | Abel | 327/538 |
| 7,218,087 B2 | 5/2007 | Lin | |
| 7,227,416 B2 * | 6/2007 | Lou et al. | 330/288 |
| 7,339,433 B2 | 3/2008 | Bhatacharya et al. | |
| 7,456,767 B2 * | 11/2008 | Abe et al. | 341/135 |
| 7,522,003 B2 * | 4/2009 | Seth et al. | 330/296 |
| 7,551,029 B2 | 6/2009 | Pan | |
| 7,642,854 B2 * | 1/2010 | Shen et al. | 330/288 |
| 7,768,351 B2 | 8/2010 | Ivanov et al. | |
| 2007/0285171 A1 * | 12/2007 | Karthaus et al. | 330/288 |

OTHER PUBLICATIONS

Barber et al., "Multi-Mode CMOS Low Dropout Voltage Regulator for GSM Handsets", Symposium on VLSI Circuits Digest of Technical Papers, pp. 284-287, Jun. 2002, IEEE.
Johns et al., "Analog Integrated Circuit Design", Chapter 5: Basic Opamp Design and Compensation, pp. 248-251, Nov. 1996, Wiley.
International Search Report and Written Opinion of the International Searching Authority in counterpart International application No. PCT/US2012/020889, communication dated May 10, 2012.

* cited by examiner

*Primary Examiner* — Linh Nguyen
(74) *Attorney, Agent, or Firm* — Kenyon & Kenyon LLP

(57) ABSTRACT

Embodiments of the present invention may provide an integrated circuit that may comprise a first transistor to receive an input voltage signal at its gate and generate an output voltage signal at its drain. Further, the integrated circuit may comprise a second transistor to form an active load of the first transistor, the second transistor may have its drain and gate coupled to the drain of the first transistor. In addition, the integrated circuit may comprise a third transistor to form a current mirror with the second transistor, a fourth transistor to form an active load of the third transistor, and a fifth transistor to form a current mirror with the fourth transistor. The fifth transistor may be connected to the drain of the second transistor. The integrated circuit may form an amplifier and Gm stage of a reference buffer.

20 Claims, 8 Drawing Sheets

BUFFER TO DRIVE REFERENCE VOLTAGE

FIELD OF INVENTION

The present invention relates to integrated circuit and particularly, to a reference buffer with an overall transconductance that is insensitive to the process, voltage and temperature (PVT) and load current variations.

BACKGROUND

Integrated circuits often need to use a reference voltage for signal processing. For example, a bandgap reference voltage has been widely used. However, the reference circuit providing the reference voltage typically does not have enough capability to drive the following circuit (e.g., ADC or DAC). In these situations, a buffer circuit is normally placed between the reference circuit and following circuit to provide the necessary driving capability. For example, a low dropout voltage regulator (LDO) can be used as a reference buffer.

FIG. 1 shows a prior art reference buffer circuit 100. The reference buffer circuit 100 has multiple low-gain wide-band amplifiers to increase an overall transconductance (Gm) and a single Gm stage to drive a following circuit (e.g., the load circuit). The low-gain wide-band amplifiers have a total gain $A_v = A_{v1} * A_{v2} * A_{v3}$ and the total transconductance $G_{m,t} = A_v * G_m$. The total transconductance $G_{m,t}$ of the prior art reference buffer circuit 100, however, is sensitive to process, voltage and temperature (PVT) and load current variations.

FIG. 2(a) illustrates a prior art reference buffer circuit 200 that shows details of the reference buffer circuit 100. As shown in FIG. 2(a), a reference voltage $V_{ref}$ is applied to a first input of a first stage amplifier 202, an output voltage $V_{out}$ of the reference buffer circuit 200 is applied via a feedback loop to a second input of the amplifier 202, the outputs of the second stage amplifier 202 are input to a second stage amplifier 204. The output of the second stage amplifier 202 is coupled to a third stage amplifier. The third stage amplifier includes a resistor $R_f$, two transistors 206, 208 and two current sources 220 and 222. The output of the third stage amplifier is coupled to a Gm stage that includes a transistor 210 and a current source 224. $A_{v1}$ of the first stage amplifier and $A_{v2}$ of the second stage amplifier are determined by the transconductance ratio and device size ratio, and thus, the gains are insensitive to PVT variations. Assuming the transconductance of the transistor 206 is $g_{mn2}$, then $A_{v3} = g_{mn2} * R_f$. Further, assuming the transconductance of the transistor 210 is $g_{mpo}$, then the overall transconductance of the reference buffer circuit 200 is determined by the equation $G_{m,t} = A_{v1} A_{v2} g_{mn2} R_f g_{mpo} \propto g_{mn2} R_f g_{mpo}$. Thus, the overall transconductance of the prior art reference buffer circuit 200 is sensitive to the PVT variations. In addition, the transconductance of the output stage strongly depends on the load current, and thus, the overall transconductance is also very sensitive to the load current.

FIG. 2(b) illustrates another implementation of the 3rd stage amplifier 238 for a prior art reference buffer circuit. The 3rd stage amplifier 238 has two transistors 242 and 240. Assuming the transconductance of the transistors 240 and 242 are $g_{mp}$ and $g_{mn}$, respectively, then the output to input ratio is $$\frac{v_o}{v_i} = \frac{g_{mn}}{g_{mp}}$$

with the output impedance being $$Z_O = \frac{1}{g_{mp}}.$$

This 3rd stage amplifier is a simple active load amplifier and is insensitive to the process variation, but the DC gain is small. In one example application (e.g., an ADC), the required total amplifier gain (Av) is around 70 dB and the simple active load amplifier cannot satisfy the requirement.

The reference buffer often requires a high gain and stability is a concern for the high gain. Therefore, there is a need in the art for providing a reference buffer with a high gain and an overall transconductance that is insensitive to PVT and load current variations.

DETAILED DESCRIPTION

Embodiments of the present invention may provide an integrated circuit that may comprise a first transistor to receive an input voltage signal at its gate and generate an output voltage signal at its drain. Further, the integrated circuit may comprise a second transistor to form an active load of the first transistor, the second transistor may have its drain and gate coupled to the drain of the first transistor. In addition, the integrated circuit may comprise a third transistor to form a current mirror with the second transistor, a fourth transistor to form an active load of the third transistor, and a fifth transistor to form a current mirror with the fourth transistor. The fifth transistor may be connected to the drain of the second transistor. The integrated circuit may form an amplifier and Gm stage of a reference buffer.

Figure 1:
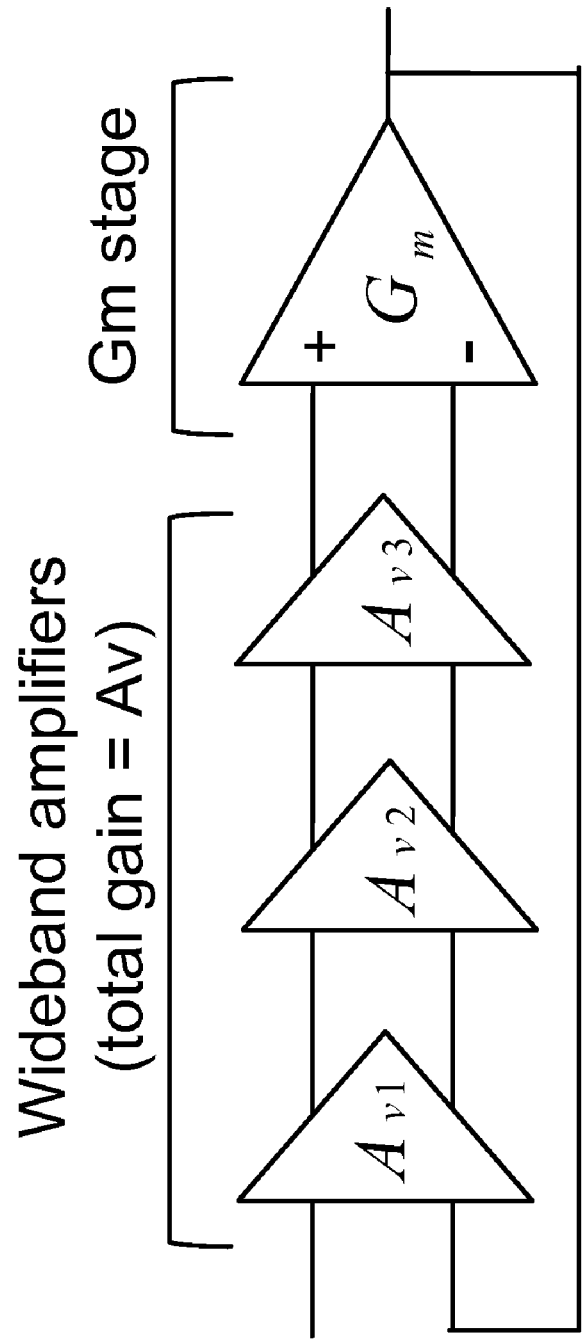
FIG. 1 illustrates a prior art reference buffer circuit.
Figure 2:
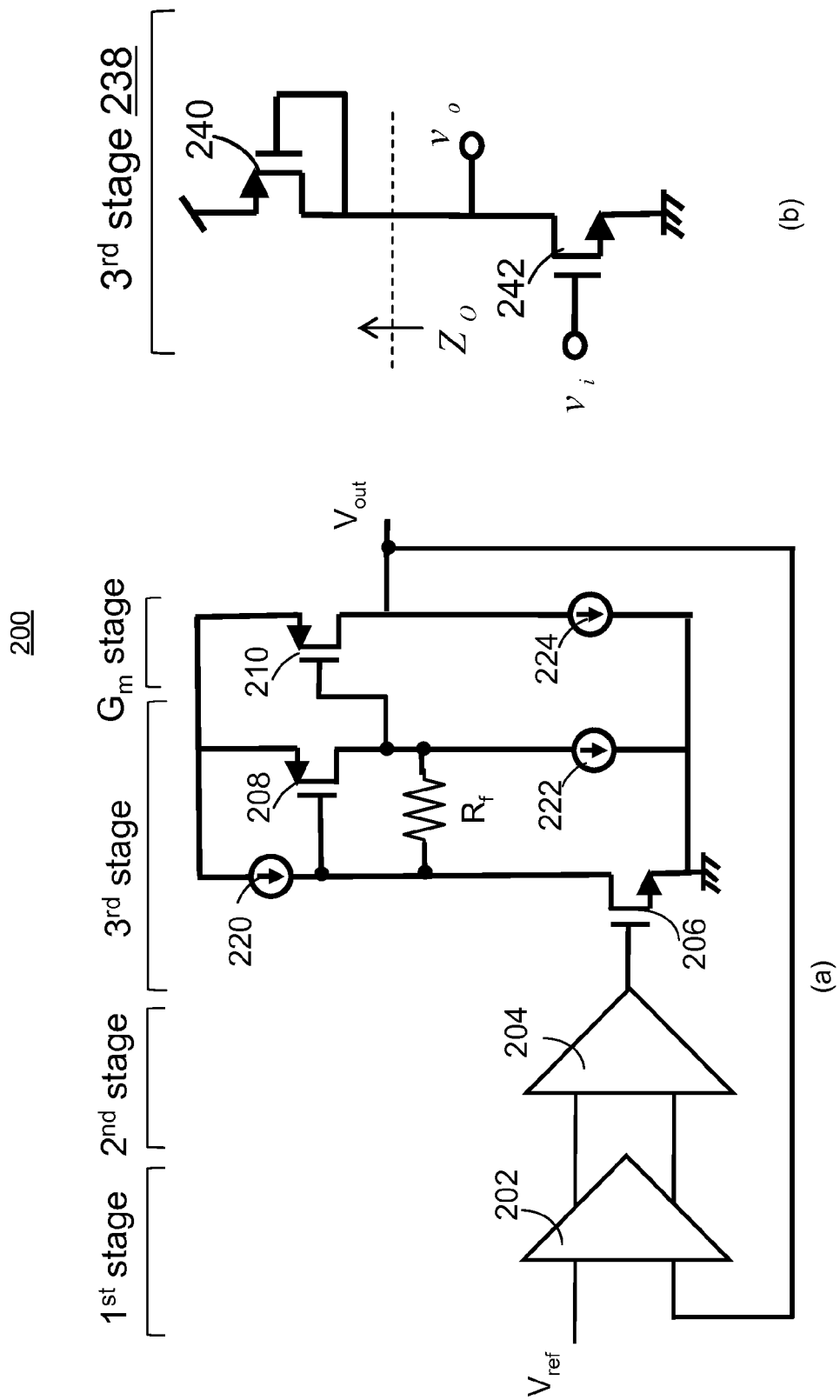
FIG. 2(a) illustrates prior art reference buffer circuit in more detail.
FIG. 2(b) illustrates another prior art 3rd stage amplifier for a reference buffer circuit.
Figure 3:
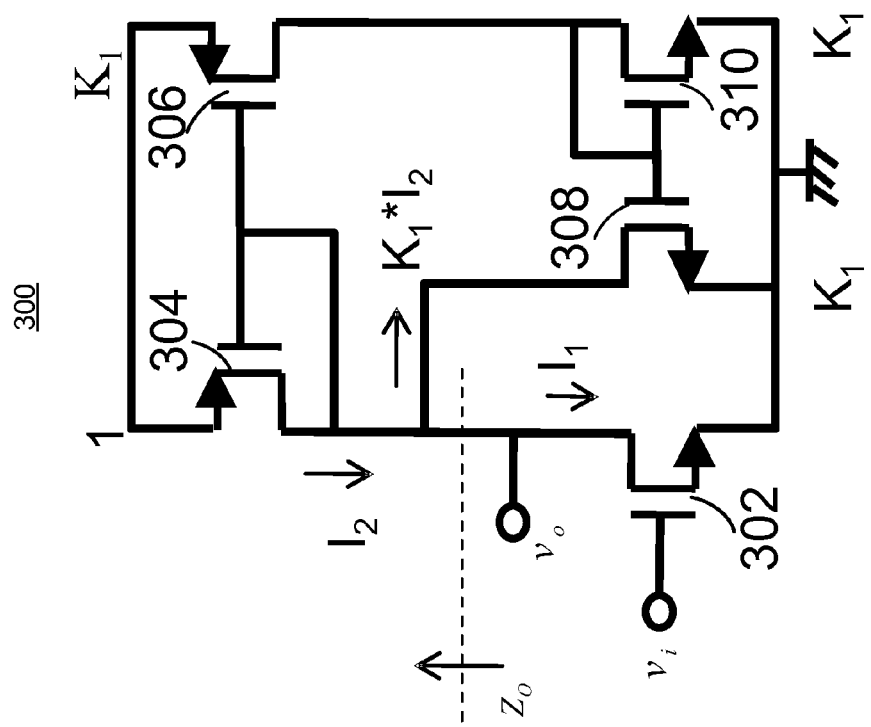
FIG. 3 illustrates an amplifier circuit in accordance with one exemplary embodiment of the present invention.

FIG. 3 illustrates an amplifier circuit 300 in accordance with one exemplary embodiment of the present invention. The amplifier circuit 300 may comprise a transistor 302 to receive an input signal $v_i$ at its gate. The drain of the transistor 302 may provide an output signal $v_o$ and the source of the transistor 302 may be grounded. The amplifier circuit 300 may further comprise transistors 304, 306, 308 and 310. The transistors 304 and 306 may form a first current mirror and the transistors 308 and 310 may form another current mirror.

In one embodiment, the transistors 306, 308 and 310 may have a device size K1 relative to the size of the transistor 304 respectively, and thus, each has a device size ratio of K1:1 with respect to the transistor 304. If the current flowing through the transistor 304 is designated as $I_2$, then the mirror current flowing through the transistor 306 and hence the transistor 310 may be $K1*I_2$. Because the transistor 308 and 310 are of the same device size, the mirror current flowing through the transistor 308 may be also $K1*I_2$. If the current flowing through the transistor 302 is designated as $I_1$, then $I_2=K_1 \cdot I_2+I_1$, and thus, $I_1=(1-K_1) \cdot I_2$. Assuming the transconductance of the transistor 304 is $g_{mp}$, then the output impedance may be determined as $$Z_O = \frac{1}{1-K_1} \cdot \frac{1}{g_{mp}}.$$

Accordingly, assuming the transconductance of the transistor 304 is $g_{mn}$, the gain of the amplifier circuit 300 may be determined by the equation of $$\frac{v_o}{v_i} = g_{mn} \cdot Z_O = \frac{1}{1-K_1} \cdot \frac{g_{mn}}{g_{mp}}.$$

In the example shown in FIG. 3, K1 may be 0.8. Thus, the output impedance of the amplifier circuit 300 may be boosted by a factor of five (5)

$$\left(\text{e.g., } \frac{1}{1-K_1} = 5\right).$$

With this configuration, however, the current $I_i$ flowing through the transistor 302 may be decreased and the transconductance of the transistor 302 may also be reduced. Therefore, although the amplifier circuit 300 may still have a higher gain compared to the simple active load amplifier 238, the gain may be reduced because of the reduced transconductance of the transistor 302. Nevertheless, the amplifier circuit 300 may be insensitive to the process variations.

Figure 4:
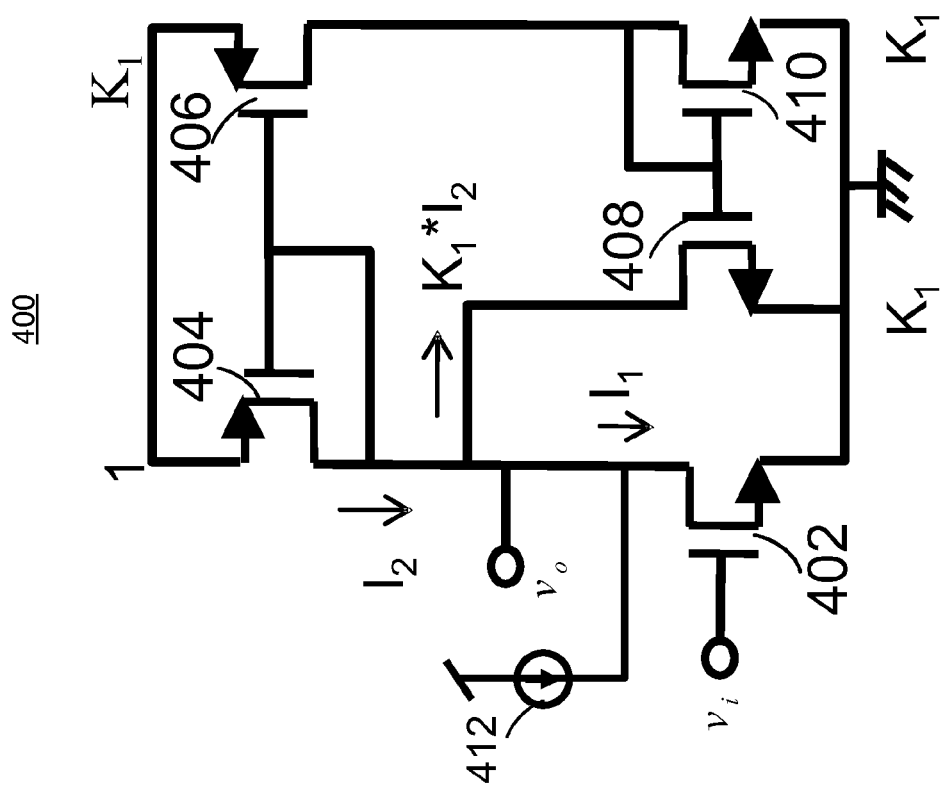
FIG. 4 illustrates another amplifier circuit in accordance with one exemplary embodiment of the present invention.

FIG. 4 illustrates another amplifier circuit 400 in accordance with one exemplary embodiment of the present invention. The amplifier circuit 400 may comprise transistors 402, 404, 406, 408 and 410. These transistors may have physical characteristics similar to the transistors 302, 304, 306, 308 and 310 respectively (e.g., device sizes have a relative ratio of 1:K1:K1:K1 for the transistors 404, 406, 408 and 410). Further, these transistors may be configured similar to the configuration of the amplifier circuit 300. That is, the transistor 402's gate may be coupled to an input signal, the transistors 404 and 406 may form a first current mirror, and the transistors 408 and 410 may form another current mirror.

In addition, the amplifier circuit 400 may further comprise a current source 412 coupled to the drain of the transistor 402 to provide a bias current h. Thus, the current flowing through the transistor 402 may be determined by the equation $I_1=(1-K_1) \cdot I_2+I_b$. And therefore, the transconductance of the transistor 402 may be increased over the transconductance of the transistor 302 and the gain of the amplifier circuit 400 may be increased over that of the amplifier circuit 300. The bias current $I_b$ may be an optional bias current. In one embodiment, the bias current $I_b$ may be provided by a Gm-constant bias circuit (e.g., the Gm-constant bias circuit shown in FIG. 6).

Figure 5:
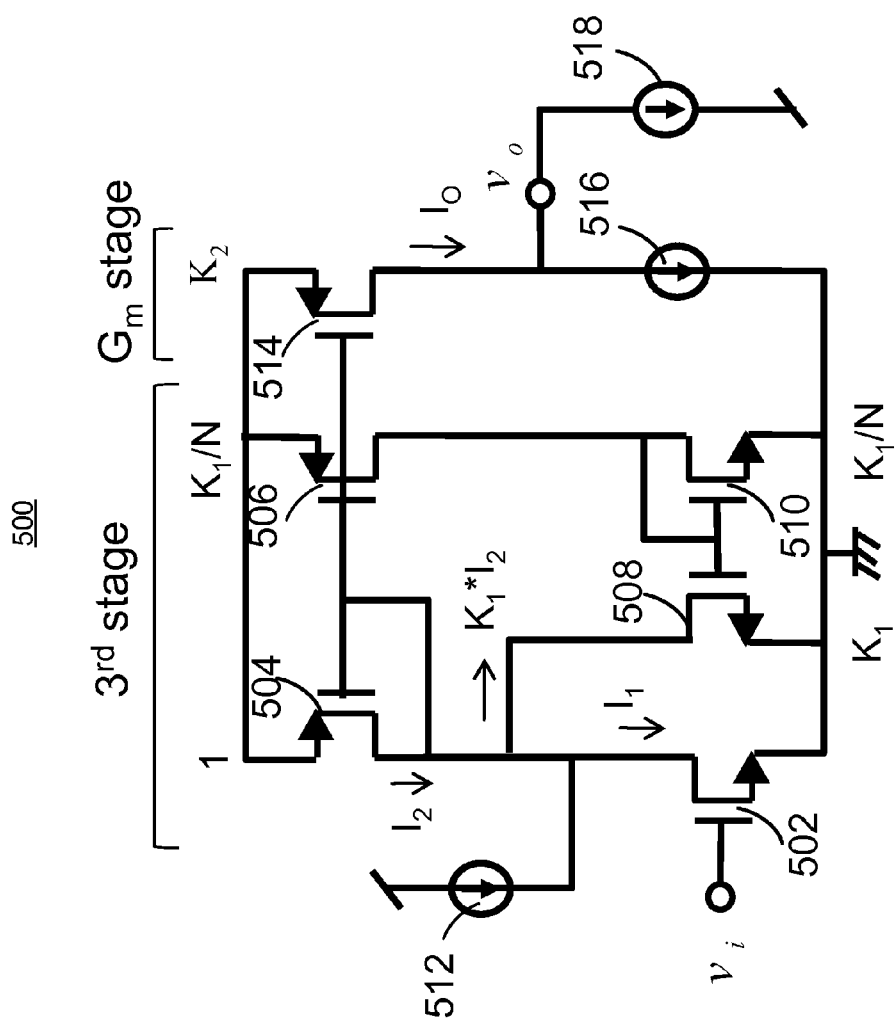
FIG. 5 illustrates a partial reference buffer in accordance with one exemplary embodiment of the present invention.

FIG. 5 illustrates a partial reference buffer 500 in accordance with one exemplary embodiment of the present invention. The partial reference buffer 500 may comprise a third stage amplifier and a Gm stage. The third stage amplifier may be similar to the amplifier circuit 400 and comprises a bias current source 512, and transistors 502, 504, 506, 508 and 510. The Gm stage may comprise a transistor 514 and a bias current source 516. The partial reference buffer 500 may further comprise a current source 518 to represent a load current.

In the third stage amplifier, the gate of the transistor 502 may be coupled to an input signal $v_i$. The transistors 504 and 506 may form a first current mirror and the transistors 508 and 510 may form another current mirror. The device size ratio between the transistors 508 and 504 may be K1:1. The device size ratio between the transistors 506 and 504 may be K1/N:1. The device size ratio between the transistors 510 and 504 may also be K1/N:1. N may be a number selected based on desired mirror ratio. N may be equal to one, larger than one or less than one. When N is learger than one, however, the bias current of 506 may become small and save power. Similar to the configuration of the amplifier circuit 400, the current flowing through the transistor 504 may be divided between the transistors 502 and 508. With the addition of the bias current $I_{b1}$ provided by the current source 512, the current flowing through the transistor 502 may be determined by the equation $I_1=(1-K_1) \cdot I_2+I_{b1}$.

The gate of the transistor 514 may be coupled to the gate of the transistor 504, and the transistor 514 may form a current mirror with the transistor 504. The output current flowing through the transistor 514 (e.g., $I_o$) may be determined by the equation of $I_o=K_2 \cdot I_2$, with the gain determined by the ratio of the transconductance of the transistors 514 to the transconductance of the transistor 504

$$\left(\text{e.g., } K_2 = \frac{g_{mpo}}{g_{mp}}\right).$$

Therefore, the output current $I_o$ may be determined by the equation of $$I_o = \frac{K_2}{1-K_1}(I_1 - I_{b1}).$$

The current flowing through the transistor 502 may be determined by the equation of $$I_1 = \frac{1-K_1}{K_2} \cdot I_O + I_{b1}.$$

The overall transconductance $G_m'$ of the partial reference buffer circuit 500 may be determined by the equation of $$G_m' = \frac{\partial I_O}{\partial v_i} = \frac{K_2}{1-K_1} \frac{\partial I_1}{\partial v_i} = \frac{K_2}{1-K_1} g_{mn}.$$

Thus, the current flowing through the transistor 502 may be less sensitive to the output current $I_o$, and so is the transconductance $g_{mn}$ of the transistor 502. Further, the overall transconductance $G_m'$ of the partial reference buffer circuit 500 may be determined by the transconductance $g_{mn}$ of the transistor 502 and device ratio, and also may be less sensitive to the output current $I_o$ In one embodiment, for example, K1 may be 0.8 and K2 may be 10. Accordingly, the overall transconductance $G_m'$ may equal to $50 \cdot g_{mn}$ and the current $I_1$ may equal to $0.02 \cdot I_o+I_{b1}$.

The bias current $I_{b2}$ through the current source 516 and the load current $I_L$ through 518 may divide the current $I_o$. In one embodiment, the load current $I_L$ may be a relatively large current compared to the bias current $I_{b2}$.

Figure 6:
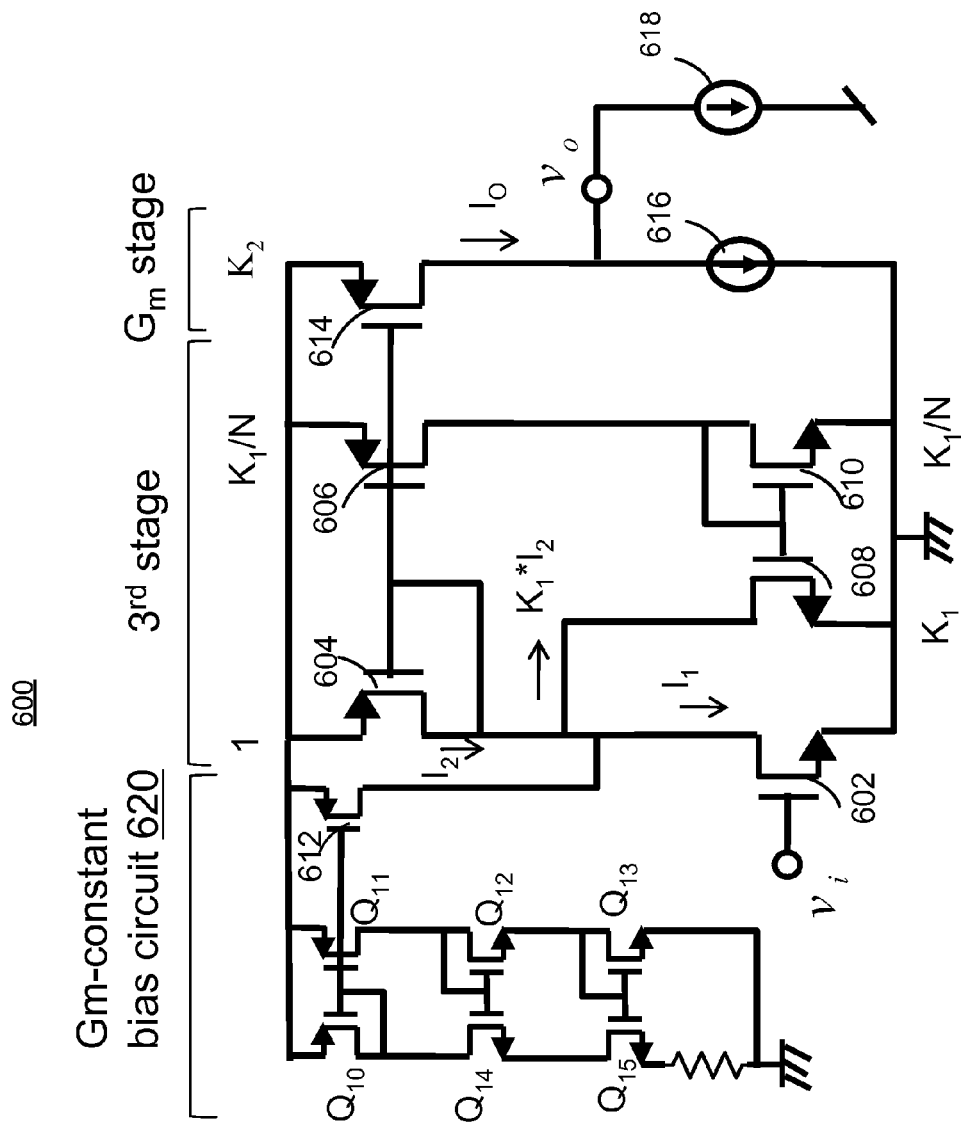
FIG. 6 illustrates a partial reference buffer in accordance with one exemplary embodiment of the present invention.

FIG. 6 illustrates a partial reference buffer 600 in accordance with one exemplary embodiment of the present invention. The partial reference buffer 600 may comprise a third stage amplifier and a Gm stage that are similar to those of the partial reference buffer 500. That is, the third stage amplifier of the partial reference buffer 600 may comprise transistors 602, 604, 606, 608 and 610 with device size and configuration similar to the corresponding transistors 502, 504, 506, 508 and 510 of the partial reference buffer 500. Further, the Gm stage of the partial reference buffer 600 may comprise a transistor 614 and a current source 616 and a load current 618 that are similar to the transistor 514 and current sources 516 and 518. The difference between the partial reference buffer 600 from the partial reference buffer 500 may be that the current source 512 in the partial reference buffer 600 may be a Gm-constant bias circuit 620.

The Gm-constant bias circuit 620 may comprise a pair of current mirror Q10 and Q11. Further, the Gm-constant bias circuit 620 may comprise transistors Q12, Q13 chained between Q11 and the ground, and transistors Q14, Q15 and resistor $R_B$ chained between Q10 and the ground. The Gm-constant bias circuit 620 may further comprise a transistor 612 with its gate coupled to the gates of Q10 and Q11. The bias current provided by the Gm-constant bias circuit 620 may flow through the transistor 602. The Gm-constant bias circuit 620 may be a known circuit configuration that provides, to a first-order effect, transistor transconductance and hence bias current to be independent of PVT variations.

Figure 7:
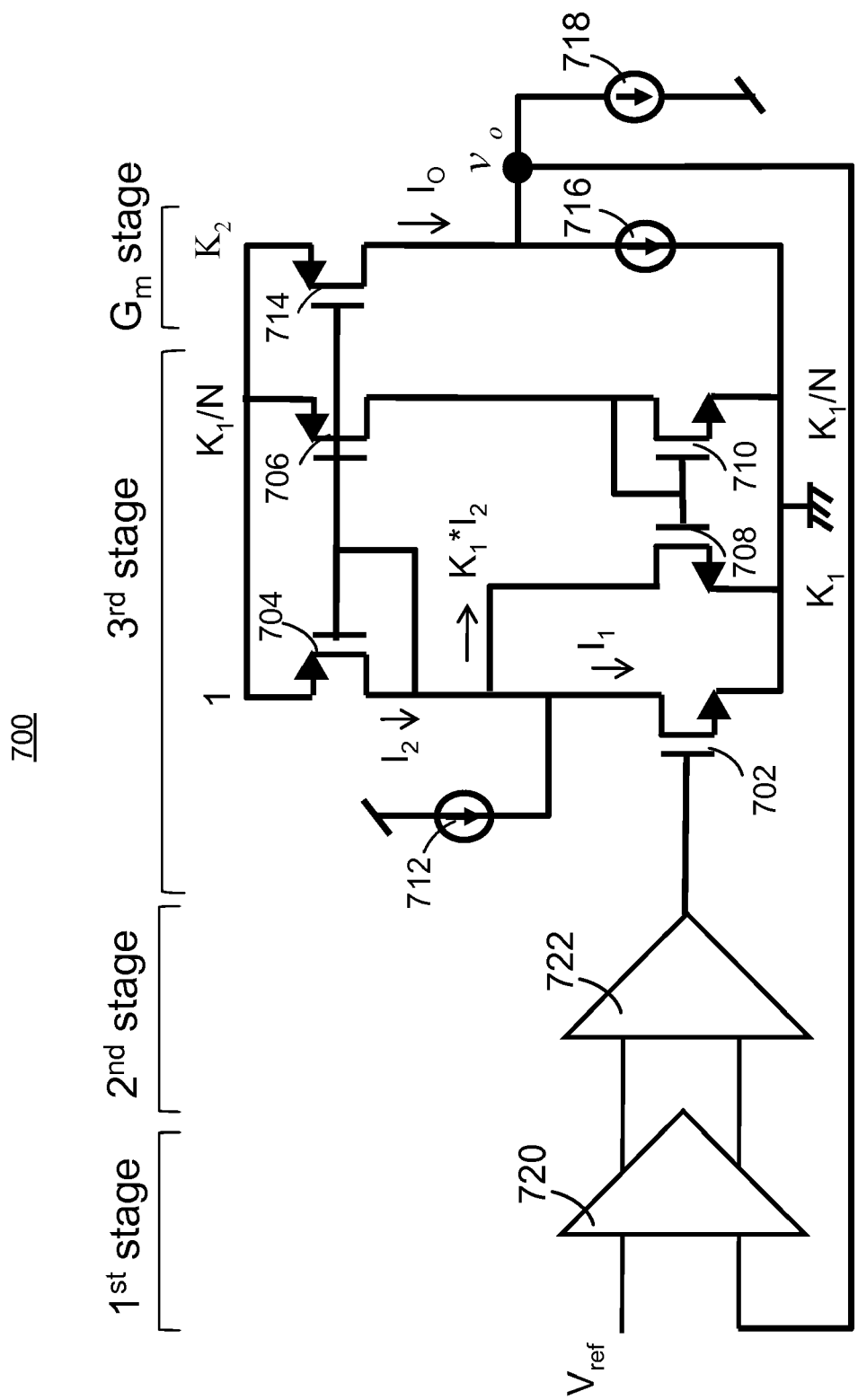
FIG. 7 illustrates a reference buffer in accordance with one exemplary embodiment of the present invention.

FIG. 7 illustrates a reference buffer 700 in accordance with one exemplary embodiment of the present invention. The reference buffer 700 may comprise a first and second stage amplifiers 720 and 722, a third stage amplifier and a Gm stage. The third stage amplifier and the Gm stage may be similar to the partial reference buffer 500. That is, the transistors 702, 704, 706, 708, 710 and 714 may be similar to the transistors 502, 504, 506, 508, 510 and 516 respectively and have similar configurations. The current sources 712, 716 and 718 may be similar to the current sources 512, 516 and 518 respectively, and have similar configurations. Thus, the explanations for the third stage amplifier and the Gm stage of the partial reference buffer 500 are also applicable here. The first stage amplifier 720 may be a differential amplifier having a first input coupled to a reference voltage (e.g., bandgap reference voltage) and a second input coupled to the output voltage signal $V_o$ via a feedback loop. The output from the first stage amplifier 720 may be further amplified by the second stage amplifier 722, which in embodiment, may also be a differential amplifier. The output from the second stage amplifier 722 may be coupled to the gate of the transistor 702.

The overall transconductance of the reference buffer 700 may be determined by all four stages. If the first and send stage amplifiers have gains of $A_{v1}$ and $A_{v2}$ respectively, and the third stage amplifier and Gm stage combined have a transconductance of $G_m'$ as described above with respect to FIG. 5, then the overall transconductance of the reference buffer 700 may be determined by the equation of $$G_{m,t} = A_{V1}A_{V2}G_m' = A_{V1}A_{V2}\frac{\partial I_O}{\partial v_i} = A_{V1}A_{V2}\frac{K_2}{1-K_1}\frac{\partial I_1}{\partial v_i} = A_{V1}A_{V2}\frac{K_2}{1-K_1}g_{mn} \propto g_{mn}.$$

In one example, K1 may be 0.8 and K2 may be 10, and thus, $G_{m,t}=50A_{V1}A_{V2}g_{mn}$. Further, as shown in FIG. 6 and described above, in one embodiment, the current source 712 may be a Gm-constant bias circuit. Therefore, the transconductance $g_{mn}$ of the transistor 702 may be more constant and less sensitive to the PVT variation.

Figure 8:
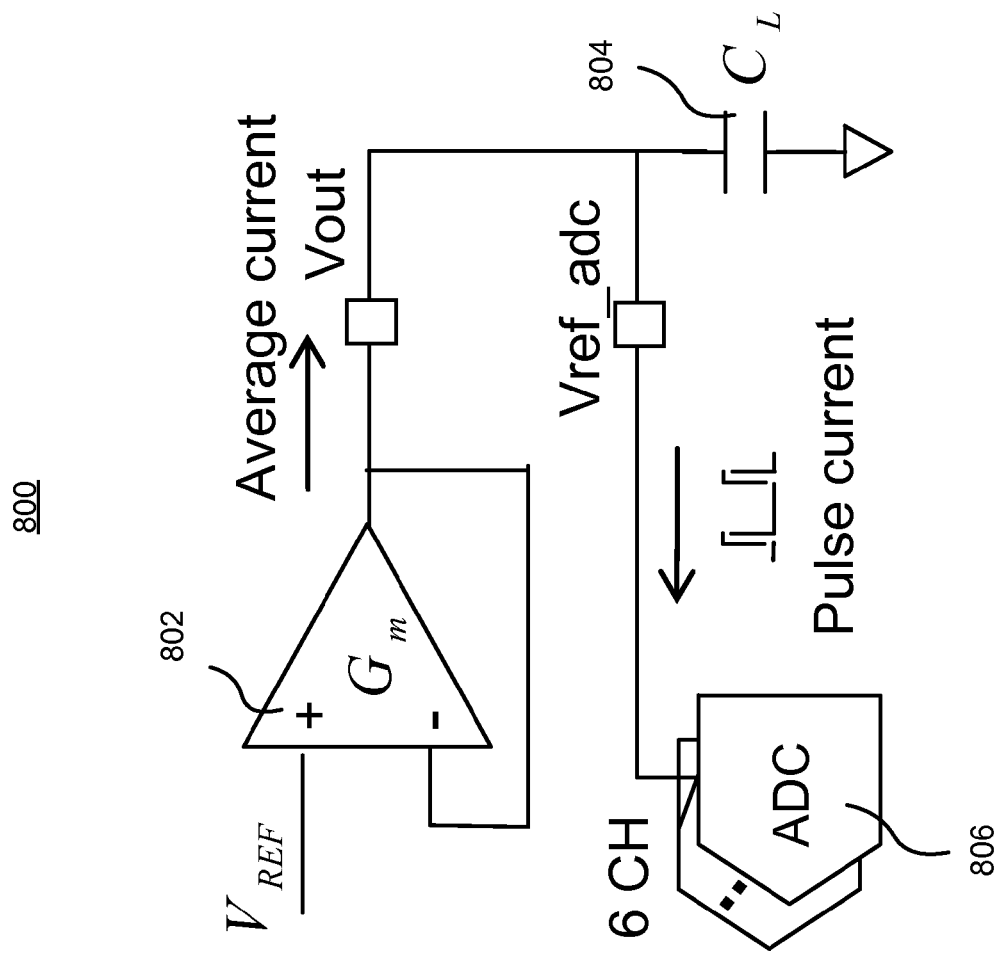
FIG. 8 illustrates a multichannel ADC circuit in accordance with one exemplary embodiment of the present invention.

FIG. 8 illustrates a multichannel ADC circuit 800 in accordance with one exemplary embodiment of the present invention. The multichannel ADC circuit 800 may comprise a reference buffer 802, a capacitor $C_L$ 804 and multiple ADCs 806. Each ADC 806 may be a successive approximation register analog-to-digital converter (SAR ADC) and correspond to one channel. In its operation, each ADC 806 may sample an input voltage and compare it to a plurality of threshold voltages on a bit by bit basis. In this end, each SAR ADC may include one or more capacitor arrays to store sampled voltages and to generate reference voltages, and a comparator to compare the sampled voltage to each reference voltage and perform bit decisions. The reference buffer 802 may supply the reference current to charge the capacitors of the capacitor arrays to establish reference voltages. The capacitor $C_L$ 804 may be an external large capacitor (e.g., 10 μF) and may supply pulse charge at a mega hertz frequency to provide a reference voltage of $V_{ref\_adc}$ to the SAR ADCs.

The reference buffer 802 may be a reference buffer 700 as described above. In the reference buffer 802, a single Gm stage may be used to drive the large load capacitance of the capacitor $C_L$ 804 and the dominant pole may be determined by the load capacitor. The single-stage Gm, however, may not be large enough (several mS) to achieve low output impedance, and thus, low-gain wide-band amplifiers may be used to increase the overall Gm. Therefore, the total transconductance Gm,t may be the product of the gains by each stages (e.g., Gm,t=Av*Gm). It should be noted that although the reference buffer 700 shows only 3 stages of low-gain wide-band amplifiers, more stages (e.g., 4 or 5, or more), or less stages (e.g., 1, or 2) may be used in front of the Gm stage. Similarly, the $3^{rd}$ stage amplifier referred to in FIGS. 3-6 may be a n-th stage depend on the number of the stages desired. No matter how many stages, however, bandwidth of each amplifier may need to be wider than the overall Unity Gain Frequency (UGF), at which frequency the overall amplifier gain may become unity (e.g., the gain is equal to one). In one embodiment, the total amplifier gain (Av) may be around 70 dB and the ADC reference current may be a "sink" current. Also, in one embodiment, the Gm stage may be a class-A Gm stage instead of class-AB stage. Further, because the ADC reference current flowing out of the reference buffer flows through the transistor 714, this means that the ADC reference current is re-used as the bias current of 714 which may result in the increased transconductance and also save power.

In one embodiment, the multichannel ADC circuit 800 may be a 6-channel 14-bit 2-Msps SAR ADC. The pulse charge may be supplied at a 40-MHz by the capacitor $C_L$ 804. The reference buffer 802 may supple an average ADC reference current of 600uA with a range of +/−30% and may be signal dependent. Further, the reference buffer 802 may supply the average current such that the shift in the output voltage is within a half LSB (e.g., 55uV). In one embodiment, the output impedance of the reference buffer 802 may be around 150 mΩ which corresponds to the transconductance of 7 S.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. An amplifier circuit comprising:
   a first transistor to receive an input voltage signal at its gate and generate an output voltage signal at its drain;

a second transistor to form an active load of the first transistor, the second transistor having its drain and gate coupled to the drain of the first transistor;

a third transistor to form a current mirror with the second transistor;

a fourth transistor to form an active load of the third transistor; and a fifth transistor to form a current mirror with the fourth transistor, the fifth transistor being connected to the drain of the second transistor.

2. The amplifier circuit of claim 1, wherein a device ratio between the second transistor and the fifth transistor is 1:K1 with K1 being a number less than one.

3. The amplifier circuit of claim 1, further comprising a sixth transistor as part of a transconductance (Gm) stage, the gate of the sixth transistor being coupled to the gate of the second transistor, and the second transistor and sixth transistor forming a current mirror.

4. The amplifier circuit of claim 3, further comprising a first and second current sources, wherein the current flowing through the sixth transistor are divided between the first and second current sources.

5. The amplifier circuit of claim 4, wherein a device ratio between the second transistor and the sixth transistor is 1:K2 with K2 being a number larger than one, the first current source providing a bias current for the sixth transistor and the second current source providing a load current for a following circuit.

6. The amplifier circuit of claim 1, further comprising a bias current source to provide a bias current to the first transistor.

7. The amplifier circuit of claim 6, wherein the bias current source is a Gm-constant bias circuit.

8. The amplifier circuit of claim 1, further comprising:

a plurality of differential amplifiers chained together to generate the input voltage signal, and a Gm stage that comprises a sixth transistor, the gate of the sixth transistor being coupled to the gate of the second transistor, and the second transistor and sixth transistor forming a current mirror, wherein the Gm stage generates an output signal at the drain of the sixth transistor, the first differential amplifier has a first input terminal coupled to a reference voltage and a second input terminal coupled to the output signal at the drain of the sixth transistor via a feedback loop.

9. The amplifier circuit of claim 8, wherein the reference voltage is a bandgap reference voltage and the integrated circuit provides a reference buffer.

10. A reference buffer circuit comprising:

a plurality of cascaded amplifiers; and a transconductance (Gm) stage coupled to a last amplifier of the plurality cascaded amplifiers, wherein the last amplifier comprises:

a first transistor to receive an input voltage signal at its gate and generate an output voltage signal at its drain, the input voltage signal being generated by a preceding differential amplifier;

a second transistor to form an active load of the first transistor, the second transistor having its drain and gate coupled to the drain of the first transistor;

a third transistor to form a current mirror with the second transistor;

a fourth transistor to form an active load of the third transistor; and a fifth transistor to form a current mirror with the fourth transistor, the fifth transistor being connected to the drain of the second transistor; and the Gm stage comprises:

a sixth transistor, the gate of the sixth transistor being coupled to the gate of the second transistor, and the second transistor and sixth transistor forming a current mirror, and a first and second current sources, wherein the current flowing through the sixth transistor are divided between a bias current and a load current, the Gm stage generating an output signal at the drain of the sixth transistor, the first amplifier of the plurality of stages of amplifiers has a first input terminal coupled to a reference voltage and a second input terminal coupled to the output signal at the drain of the sixth transistor via a feedback loop.

11. The reference buffer circuit of claim 10, wherein a device ratio between the second transistor and the fifth transistor is 1:K1 with K1 being a number less than one.

12. The reference buffer circuit of claim 10, wherein a device ratio between the second transistor and the sixth transistor is 1:K2 with K2 being a number larger than one.

13. The reference buffer circuit of claim 10, further comprising a bias current source to provide a bias current to the first transistor.

14. The reference buffer circuit of claim 13, wherein the bias current source is a Gm-constant bias circuit.

15. A multichannel analog-to-digital converter (ADC) circuit comprising:

a plurality of successive approximation register analog-to-digital converters (SAR ADCs);

a capacitor to supply pulse current to the SAR ADCs; and a reference buffer to supply average current to the external capacitor, the reference buffer comprising:

a plurality of cascaded amplifiers; and a transconductance (Gm) stage coupled to a last amplifier of the plurality of cascaded amplifiers, wherein the last amplifier comprises:

a first transistor to receive an input voltage signal at its gate and generate an output voltage signal at its drain, the input voltage signal being generated by a preceding differential amplifier;

a second transistor to form an active load of the first transistor, the second transistor having its drain and gate coupled to the drain of the first transistor;

a third transistor to form a current mirror with the second transistor;

a fourth transistor to form an active load of the third transistor; and a fifth transistor to form a current mirror with the fourth transistor, the fifth transistor being connected to the drain of the second transistor; and the Gm stage comprises:

a sixth transistor, the gate of the sixth transistor being coupled to the gate of the second transistor, and the second transistor and sixth transistor forming a current mirror, and a first and second current sources, wherein the current flowing through the sixth transistor are divided between a bias current and a load current, the Gm stage generating an output signal at the drain of the sixth transistor, the first amplifier of the plurality of stages of amplifiers has a first input terminal coupled to a reference voltage and a second input terminal coupled to the output signal at the drain of the sixth transistor via a feedback loop.

16. The multichannel ADC circuit of claim 15, wherein a device ratio between the second transistor and the fifth transistor is 1:K1 with K1 being a number less than one.

17. The multichannel ADC circuit of claim 15, wherein a device ratio between the second transistor and the sixth transistor is 1:K2 with K2 being a number larger than one.

18. The multichannel ADC circuit of claim 15, further comprising a bias current source to provide a bias current to the first transistor.

19. The multichannel ADC circuit of claim 18, wherein the bias current source is a Gm-constant bias circuit.

20. The multichannel ADC circuit of claim 15, wherein the reference voltage is a bandgap reference voltage.

* * * * *